United States Patent
Jun et al.

(10) Patent No.: US 11,716,082 B2
(45) Date of Patent: Aug. 1, 2023

(54) CAPACITIVE TOUCH SENSOR AND METHOD

(71) Applicant: TEXAS INSTRUMENTS INCORPORATED, Dallas, TX (US)

(72) Inventors: Zhang Jun, Shanghai (CN); Shen Ge, Shanghai (CN); Xu Kang Cheng, Shanghai (CN); Zhou Yi, Shanghai (CN); Hao Meng, Shanghai (CN); Ji Ru Jun, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/547,439

(22) Filed: Dec. 10, 2021

(65) Prior Publication Data

US 2022/0103173 A1    Mar. 31, 2022

Related U.S. Application Data

(60) Division of application No. 16/735,878, filed on Jan. 7, 2020, now Pat. No. 11,233,508, which is a division of application No. 15/994,318, filed on May 31, 2018, now Pat. No. 10,534,491, which is a continuation of application No. 14/480,444, filed on Sep. 8, 2014, now abandoned.

(30) Foreign Application Priority Data

May 6, 2014    (WO) ................ PCT/CN2014/076848

(51) Int. Cl.
    *H03K 17/96*       (2006.01)

(52) U.S. Cl.
    CPC . *H03K 17/9622* (2013.01); *H03K 2017/9613* (2013.01); *H03K 2217/96066* (2013.01)

(58) Field of Classification Search
    CPC ................... H01L 2251/5338; H01L 51/0097
    See application file for complete search history.

(56) References Cited

U.S. PATENT DOCUMENTS

| 4,543,564 | A  | 9/1985  | Audoin et al.  |
| 5,166,934 | A  | 11/1992 | Tomiyama et al.|
| 8,519,722 | B1 | 8/2013  | Prendergast    |
| 8,537,125 | B2 | 9/2013  | Mamba et al.   |

(Continued)

FOREIGN PATENT DOCUMENTS

| CN | 101344831 A | 1/2009 |
| CN | 101470554 A | 7/2009 |

(Continued)

OTHER PUBLICATIONS

Supplementary European Search Report and Search Opinion received for EP Application No. 22152637.9 dated Jun. 1, 2022, 8 pages.

*Primary Examiner* — Van N Chow
(74) *Attorney, Agent, or Firm* — Krista Y. Chan; Frank D. Cimino

(57) ABSTRACT

A capacitive touch sensor is disclosed for use with input signal. The capacitive touch sensor includes a number n of input/output lines. Each of the number n of input/output lines is electrically disconnected from every other of the number n of input/output lines. Each of the number n of input/output lines is arranged to cross every other of the number n of input/output lines. Each of a number β of positions includes one of the number n of input/output lines crossing another of the number n of input/output lines.

20 Claims, 9 Drawing Sheets

(56) References Cited

U.S. PATENT DOCUMENTS

| | | |
|---|---|---|
| 9,285,933 B2 | 3/2016 | Kim et al. |
| 9,632,641 B2 | 4/2017 | Liu |
| 9,851,824 B2 | 12/2017 | Kida et al. |
| 10,025,422 B2 | 7/2018 | Kurasawa et al. |
| 2008/0126882 A1 | 5/2008 | Fulton et al. |
| 2012/0268142 A1 | 10/2012 | Kremin et al. |
| 2016/0139704 A1 | 5/2016 | Yi et al. |
| 2017/0185210 A1 | 6/2017 | Zhou et al. |

FOREIGN PATENT DOCUMENTS

| | | |
|---|---|---|
| CN | 102478992 A | 5/2012 |
| CN | 202453850 U | 9/2012 |
| CN | 103677469 A | 3/2014 |
| FR | 2503494 | 10/1982 |
| WO | 2011015827 | 2/2011 |

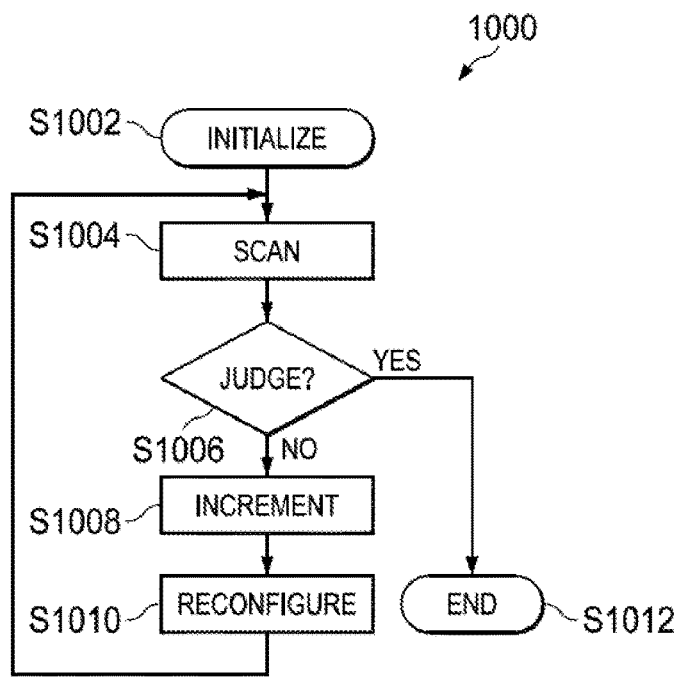
FIG. 10
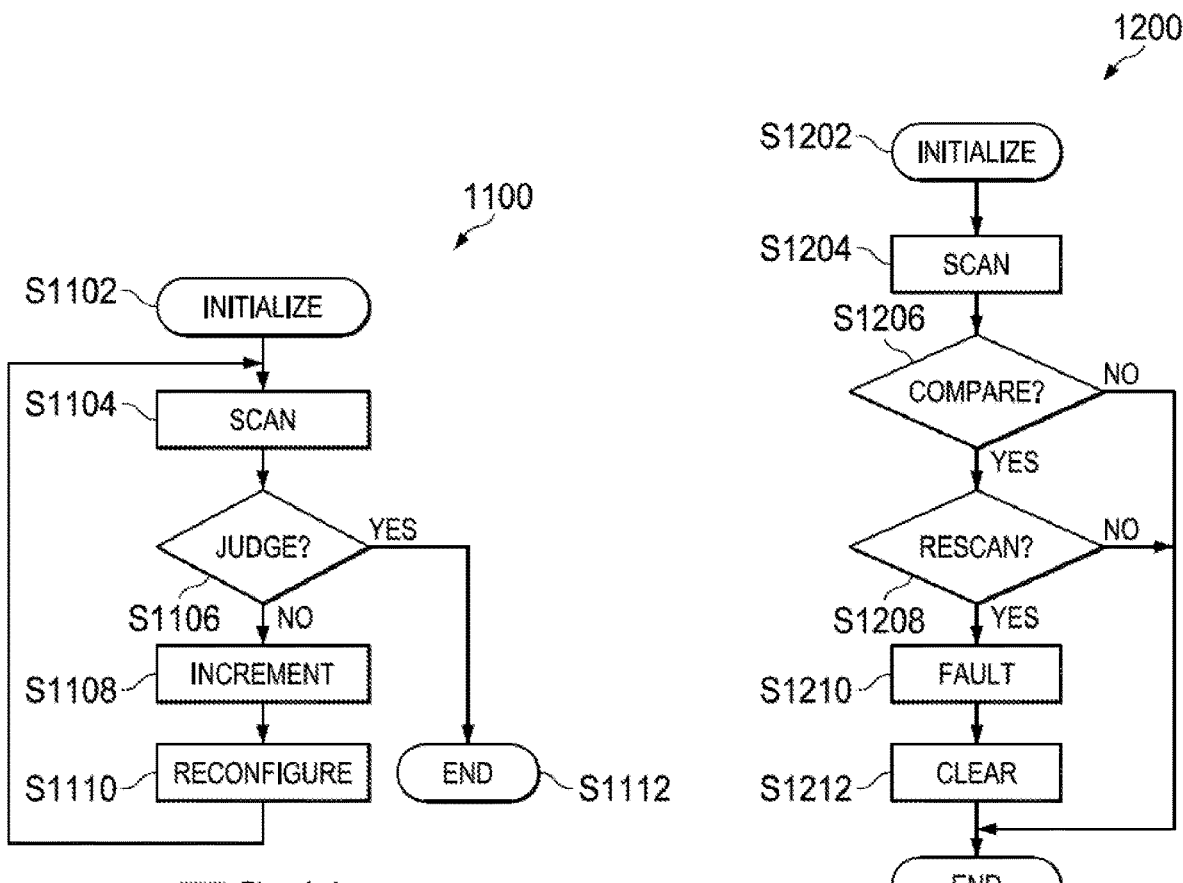
FIG. 11
FIG. 12

CAPACITIVE TOUCH SENSOR AND METHOD

CROSS-REFERENCE TO RELATED APPLICATIONS

The present application is a divisional of U.S. patent application Ser. No. 16/735,878 filed on Jan. 7, 2020, which is a divisional of U.S. patent application Ser. No. 15/994,318 filed on May 31, 2018, now U.S. Pat. No. 10,534,491, which is a continuation of U.S. patent application Ser. No. 14/480,444, filed on Sep. 8, 2014, now abandoned, which claims priority to PCT Application No. PCT/CN2014/076848, filed on May 6, 2014. The aforementioned documents are incorporated in their entireties by reference herein.

BACKGROUND

Capacitive touch sensing is widely used as the human interface for a plurality of electronic devices. Capacitive touch sensing is used in a variety of ways including proximity sensors, measuring position or displacement, humidity sensors, and computer track pads. Many of the devices that use capacitive sensing are mobile devices that have a limited amount of space for physical hardware.

Because there is a limited amount of space on mobile electronic devices, it is important to minimize the amount of space each component occupies. Conventional capacitive touch sensors require an input/output pin for each pin or pin of buttons used in a touch sensor. For larger or complex devices that require many buttons for controlling a device, the number of pins and consequently the area of the board that the pins are located on, increases very quickly.

FIG. 1 illustrates a prior art touch sensor 100.

Touch sensor 100 includes an input/output pin 102, a pin 104, a pin 106, a pin 108, a pin 110, a button 112, a button 114, a button 116, a button 118, a button 120, a button 122 and a controller 124.

Pin 102, pin 104, pin 106, pin 108, and pin 110 are operable to be set to either transmit mode or receive mode by controller 124.

Button 112 is arranged at the intersection of pin 102 and pin 108. Button 114 is arranged at the intersection of pin 104 and pin 108. Button 116 is arranged at the intersection of pin 106 and pin 108. Button 118 is arranged at the intersection of pin 102 and pin 110. Button 120 is arranged at the intersection of pin 104 and pin 110. Button 122 is arranged at the intersection of pin 106 and pin 110.

Each of button 112, button 114, button 116, button 118, button 120, and button 122 are operable to change capacitance when touched by a user.

In operation, controller 124 will set pin 102, pin 104, and pin 106 to transmit mode and each of pin 108 and pin 110 to receive mode. Once controller 124 has set each pin to the correct mode, it will transmit a signal via pin 102, pin 104, and pin 106. In this example, a signal is a voltage that is transmitted for a pre-determined amount of time. With the voltage and duration of the amount of time known, it can be determined if the signal has been modified when received.

The signals are transmitted between the vertically arranged pins and the horizontally arranged pins by one of button 112, button 114, button 116, button 118, button 120, and button 122. Each button is composed of two separate conductors that are different voltages. One of the conductors is at the voltage of the signal transmitted by controller 124 while the other is at ground; this difference in voltage creates a capacitance between the two conductors. The signal is transferred from the conductor with the higher voltage to the conductor with the lower voltage, where it then travels to a pin set to receive mode, which completes the circuit. In this manner the signal transmitted through pin 102, pin 104, and pin 106 can be received by pin 108 and pin 110.

When a user touches one of button 112, button 114, button 116, button 118, button 120, or button 122, the electric field of the two conductors is modified, this modification changes the capacitance between them. Once the capacitance has been modified the signal transmitted between the two conductors inside of each of button 112, button 114, button 116, button 118, button 120, and button 122 is modified as well.

Controller 124 will then wait for the signals to be received by pin 108 and pin 110. After pin 108 and pin 110 receive the signals transmitted by each of pin 102, pin 104, and pin 106, they send the signals to back to controller 124. After receiving the signals, controller 124 will analyze each of the signals to determine if a touch has been made by a user. Since a user has not touched any of button 112, button 114, button 116, button 118, button 120, or button 122 the signals received are unmodified and controller 124 determines that at touch has not been made. Controller 124 continues to transmit signals via pin 102, pin 104, and pin 106 and analyzing the signals received by pin 108 and pin 110 to determine if a touch has been made.

At some time later, a user will touch button 118 and controller 124 will transmit a signal via pin 102, pin 104, and pin 106. The signals received by pin 108 and pin 110 are then analyzed by controller 124. Controller 124 finds that one of the signals received has been modified by a touch input. Controller 124 then determines to which of button 112, button 114, button 116, button 118, button 120, or button 122 the modified signal corresponds. After, controller 124 will continue transmitting and analyzing signals as described above until another touch input has been detected.

FIG. 2 illustrates a prior art button arrangement 200.

As illustrated in the figure, button arrangement 200 includes a pin 202, a pin 204, a pin 206, a pin 208, a pin 210, a pin 212, a pin 214, and a pin 216.

Pin 202, pin 204, pin 206, and pin 208 are arranged such that their lines each cross the lines of pin 210, pin 212, pin 214, and pin 216 in button arrangement 200. Pin 210, pin 212, pin 214, and pin 216 are arranged such that each of their lines cross the lines of pin 202, pin 204, pin 206, and pin 208. A button is disposed at the intersection of any two lines in button arrangement 200.

In operation, an electronic device manufacturer will want to produce a capacitive touch sensor with a certain number of buttons. In this example, a manufacturer wants to create a button arrangement such that the total number of buttons is eight (8). In order to create a total of eight buttons, the total number of buttons must be a multiple of the number of pins in a column and the number of pins in a row.

Creating an arrangement with 8 buttons requires either 2 column pins and 4 row pins or 4 column pins and 2 row pins. In this non-limiting example the arrangement will be created using 4 row pins. Using pin 202, pin 204, pin 206, and pin 208 and any two of pin 210, pin 212, pin 214, or pin 216 creates a total of 8 buttons. Suppose pin 210 and pin 212 are chosen, the line of pin 210 intersects with the lines of each of pin 202, pin 204, pin 206, and pin 208 to create 4 buttons and the line of pin 212 also intersects with the lines of each of pin 202, pin 204, pin 206, and pin 208 to create an additional 4 buttons.

In another example, a manufacturer may want to create a button arrangement that contains a total of sixteen (16) buttons. Sixteen is a multiple of several different combinations, namely 1×16, 2×8, and 4×4. Since space and resources need to be conserved the row pins and column pins are chosen such that the total number of pins is minimized, in this example a 4×4 arrangement only uses eight pins.

The lines of each of pin 210, pin 212, pin 214, and pin 216 intersect with the lines of each of pin 202, pin 204, pin 206, and pin 208. Each line of pin 210, pin 212, pin 214, and pin 216 contains four (4) buttons each, for a total of sixteen (16) buttons in the arrangement.

FIG. 3 illustrates a prior art small slider 300.

As illustrated in the figure, small slider 300 includes a button 302, a button 304, a button 306, a pin 308, a pin 310, a pin 312, a pin 314, a pin 316, a pin 318, and a controller 320.

Button 302 is disposed at the intersection of the lines of pin 308 and pin 314. Button 304 is disposed at the intersection of the lines of pin 310 and pin 316. Button 306 is disposed at the intersection of the lines of pin 312 and pin 318.

Controller 320 is arranged such that it is operable to set each of pin 308, pin 310, pin 312, pin 314, pin 316, and pin 318 to either transmit mode or receive mode.

In today's electronic devices, it may be more practical to use a slider rather than a button. Sliders allow more precise control than on or off as a button does. Non-limiting examples of a slider use includes volume control, scroll bars, or zooming in or out. Creating a slider interface is more complex than a simple button due to the need for locating and tracking of the input from a user.

The operation of slider 300 is similar to that of touch sensor system 100. Controller 320 will set pin 308 to transmit mode and each of pin 310, pin 312, pin 314, pin 316, and pin 318 to received mode. Once the pins have been set to the correct mode, controller 320 will transmit a signal, via pin 308, and then analyze the signal received by each of pin 310, pin 312, pin 314, pin 316, and pin 318. Once the signals have been analyzed, controller 320 will continue setting a new pin to transmit mode and all other pins to receive mode in order to detect a touch as described above in FIG. 1.

At some later time a user will place their finger over button 302 in order to scroll the touch screen to the right and pin 308 has been set to transmit mode, while all other pins are set to receive mode. Controller 320 will transmit a signal, via the line connected to pin 308 and then analyze the signals received by each of pin 310, pin 312, pin 314, pin 316, and pin 318.

Controller 320 determines that there has been a change in the signal received by pin 314. Since the signal was output via pin 308 and a modified signal was received via pin 314, controller 320 can determine that a user has touched button 302.

Next a user will drag their finger to the point where they want to stop scrolling, which in this example, is between button 304 and button 306. Simultaneously, having analyzed all the signals received via pin 310, pin 312, pin 314, pin 316, and pin 318, controller 320 will set pin 310 to transmit mode and all other pins to receive mode. After each pin has been set to the correct mode, controller 320 will transmit a signal, via pin 310, and then analyze the signals received by each of pin 308, pin 312, pin 314, pin 316, and pin 318.

Controller 320 determines that the signal received by pin 318 has been modified. Since the signal was output via pin 310 and a modified signal was received via pin 318, controller 320 can determine that a user has touched in between button 304 and button 306. At this point, controller 320 can send instructions to scroll by an amount proportional to the distance between button 302 and the midpoint between button 304 and button 306.

In some cases a small slider may not be sufficient and a large slider must be implemented. A non-limiting example of such a case maybe, a full screen length scroll bar, a zoom function, or a fine tune controller. Suppose a full screen length scroll bar is needed, and that a total of 16 buttons needs to be used to create a scroll bar that spans the length of the screen.

Using the prior art method described above in FIG. 3, to create a scroll bar with 16 buttons would require 32 pins. With limited space and power resources, a total of 32 pins is too many to be used in a capacitive touch sensing system. Hence, an alternative method of creating a slider must be used. A method of creating a large slider will now be described with reference to FIG. 4.

FIG. 4 illustrates a prior art large slider 400.

As illustrated in the figure, large slider 400 includes a button 402, a button 404, a button 406, a button 408, a button 410, a button 412, a button 414, a button 416, a controller 418, a signal strength indicated by arrow 420, and a signal strength indicated by arrow 422.

Button 402, button 404, button 406, button 408, button 410, button 412, button 414, and button 416 are arranged such that they are each connected to two separate pins. Button 402, button 404, button 406, button 408, button 410, button 412, button 414, and button 416 are additionally arranged such that the buttons on either side have different pins.

Controller 418 is operable to receive signals from the pins of button 402, button 404, button 406, button 408, button 410, button 412, button 414, and button 416.

The operation of larger slider 400 is similar to that of small slider 300. Controller 418 will transmit a signal through one of the pins connected to button 402. The signal received by each pin of button 404, button 406, button 408, button 410, button 412, button 414, and button 416 is then sent to controller 418. Controller 418 then analyzes each signal to detect if a touch has been made.

At some later time a user will want to adjust the volume of a device and will touch a button, in this example the user touches button 408, which creates a signal strength shown by arrow 420. Simultaneously, controller 418 transmits a signal, via a pin of button 402, and the signals received by each pin of button 404, button 406, button 408, button 410, button 412, button 414, and button 416 are then analyzed by controller 418.

Controller 418 determines that multiple signals received have been modified by a user touch input. Since each of button 402, button 404, button 406, button 408, button 410, button 412, button 414, and button 416 are used twice, and both have two corresponding pins, controller 418 cannot determine which button the modified signal came from without post-processing.

After receiving multiple modified signals, controller 418 analyzes the strength and modification of each signal it received. Controller 418 determines that the strongest signals received were from the pins of button 408. Since button 408 is used twice in the slider, controller 418 must determine which one the user touched.

Controller 418 will next determine from which buttons the next strongest signals came from. Controller 418 determines that the next strongest signals came from button 406, button 410, and button 412 as shown by arrow 420. Controller 418 next determines that the weakest signals came from the pins of button 402, button 404, button 414, and button 416 as shown by arrow 422.

After analyzing the signals, controller 418 analyzes the placement of the signal strengths. Controller 418 determines that the strongest signal came from button 408, and the next strongest signals came from button 406, button 410, and button 412. From this information, controller 418 can determine that a user made a touch input at point 424 and not point 426, because of the placement of the buttons relative to each other.

If the user had made a touch input at point 426, the strongest signal would still come from the pins of button 408 but the next strongest signals would have come from the pins of button 414 and button 404. Since the location of button 404 and button 414 are far enough away from button 408 at point 424, their signals were weak which allowed controller 418 to rule out a touch input at point 426.

The problem with the conventional system and method of capacitive touch sensing is that for each additional buttons, a new pin(s) is needed. In order to create a large array of buttons, a large number of pins is needed to support the array. The increase in the number of pins needed uses limited space and resources of the capacitive touch sensing device.

Another problem with the conventional system and method of capacitive touch sensing is that creating a small slider requires two pins per button in the slider. Due to the limited space and resources, using this method it is only possible to create small sliders. It is possible to double the number of buttons used in a slider with a set number of pins, but the slider then requires post processing or additional software in order to detect user inputs.

What is needed is a system and method of increasing the number of buttons that each pin can support in a button array and slider.

BRIEF SUMMARY OF THE DRAWINGS

The accompanying drawings, which are incorporated in and form a part of the specification, illustrate example embodiments of the present invention and, together with the description, serve to explain the principles of the invention. In the drawings:

FIG. 10 illustrates a flowchart 1000, in accordance with aspects of the present invention;

FIG. 11 illustrates a flowchart 1100, in accordance with aspects of the present invention; and FIG. 12 illustrates a flowchart 1200, in accordance with aspects of the present invention.

DETAILED DESCRIPTION

The present invention provides a system and method for increasing the number of supported buttons for each pin in a capacitive touch sensing system. It is possible to create a larger array of buttons for a given number of input/output lines in accordance with an arrangement of the input/output lines in a capacitive touch sensing system.

In accordance with an aspect of the present invention, the capacitive touch sensor uses a different button arrangement. Aspects of the present invention include a button arrangement by traversing the signal path from each pin across one another other. The number of buttons that can be supported by traversing the path from of each pin such that the number of button areas, β, follows the equation:

$$\beta = \sum_{1}^{n-1} x \qquad (1)$$

Figure 1:
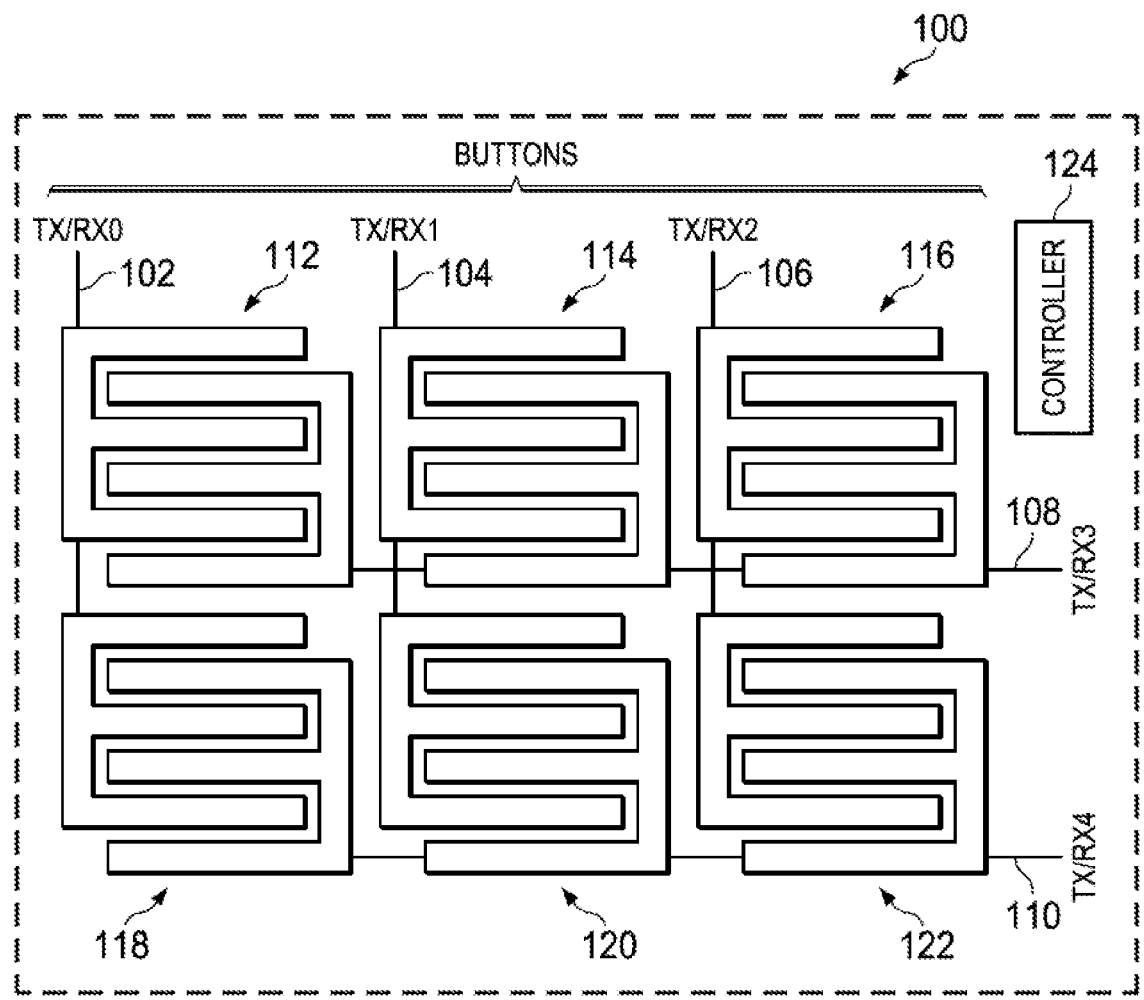
FIG. 1 illustrates prior art touch sensor system 100.
Figure 2:
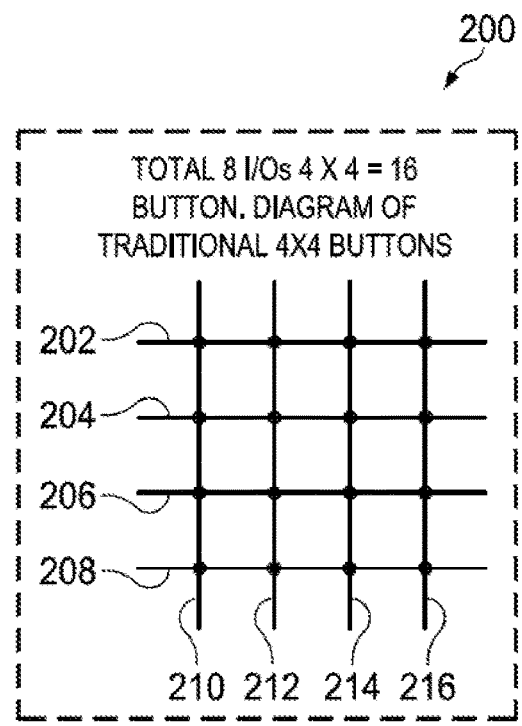
FIG. 2 illustrates a prior art button arrangement 200.
Figure 3:
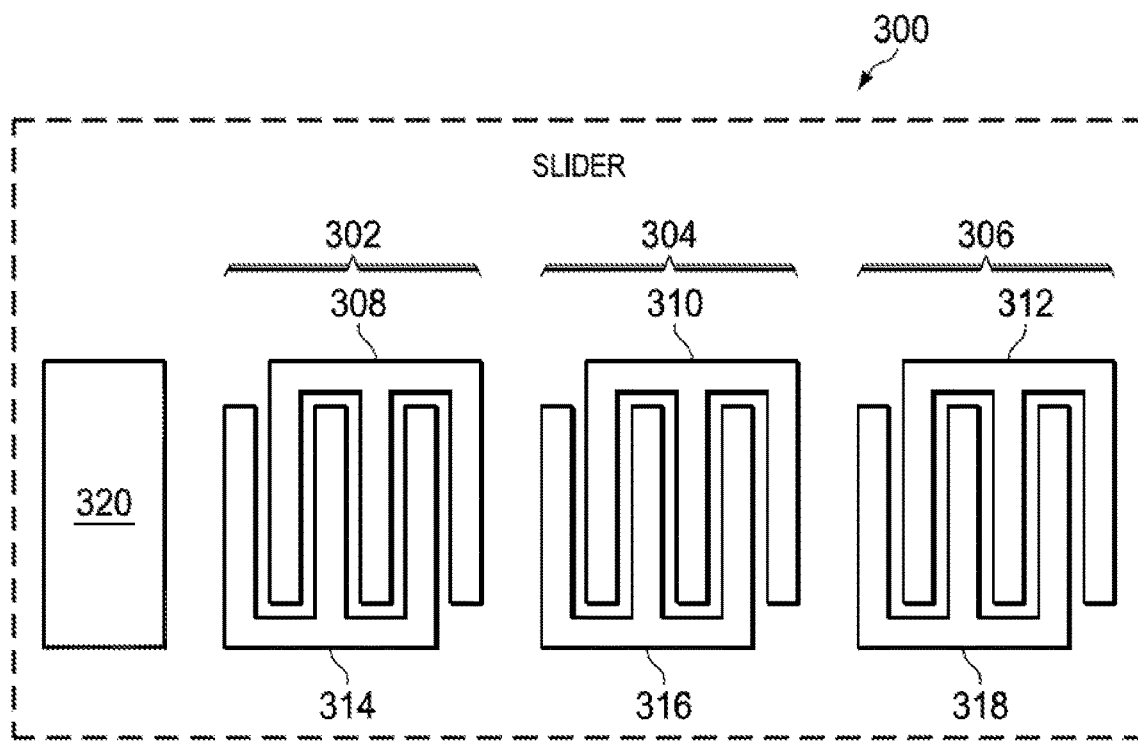
FIG. 3 illustrates a prior art small slider 300.
Figure 4:
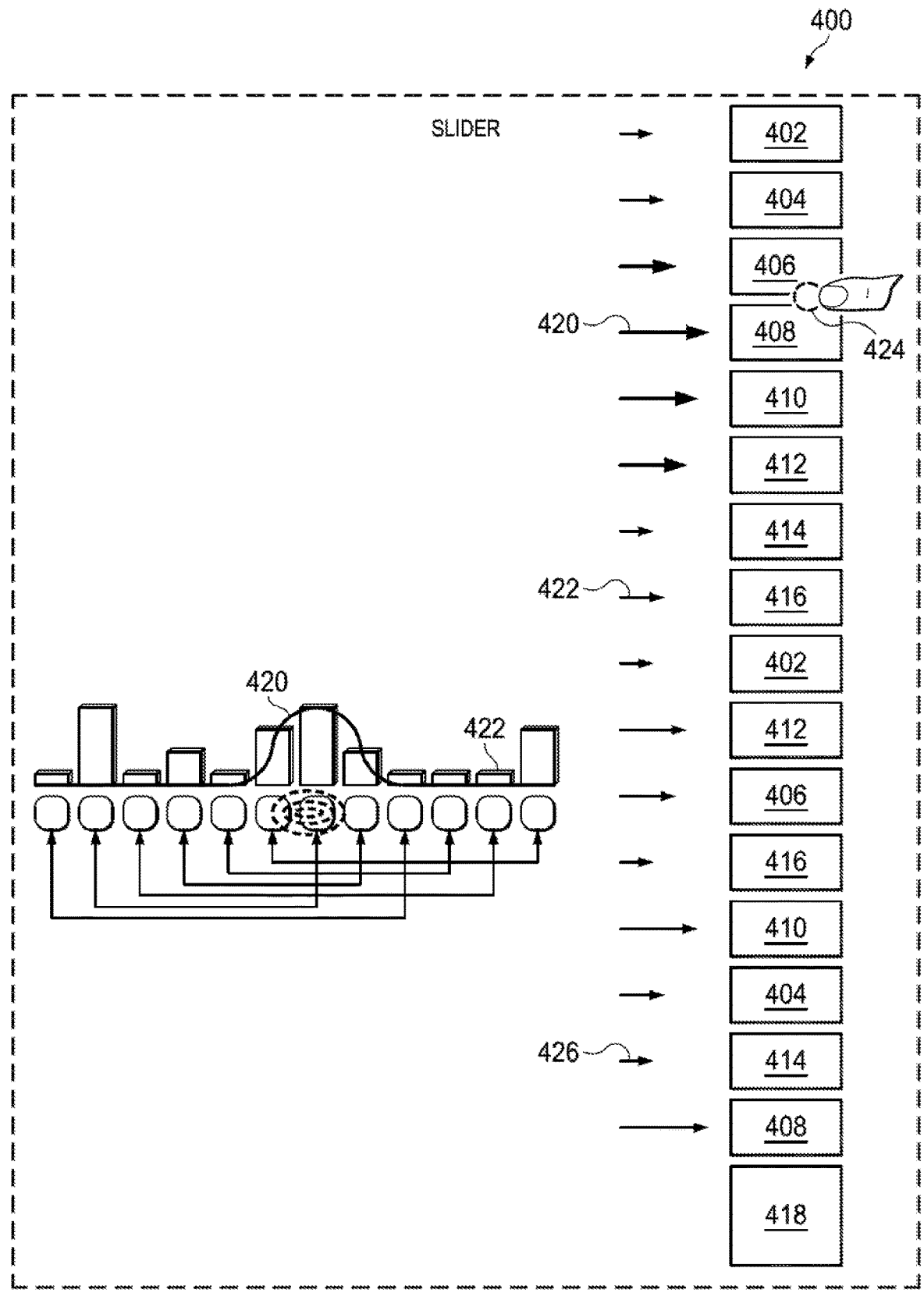
FIG. 4 illustrates a prior art small slider 400.

The variable β represents the total number of buttons that can be supported, whereas the variable n is the total number of pins used. For example, suppose a manufacturer wanted to create a capacitive touch sensor that can support six (6) buttons. In accordance with aspects of the present invention, with six buttons, β=6, and by using equation (1) it can be found that the total number of pins n needed is four (4). In contrast, using the prior art method discussed above with reference to FIGS. 1-2, a capacitive touch sensor having six (6) buttons requires a minimum of five (5) pins. As illustrated in FIG. 1, two (2) pins are used to support each row and a pin is used to support each of the three (3) columns.

In another non-limiting example embodiment, suppose a manufacturer wanted to create a capacitive touch sensor that can support a 36-key keyboard—26 buttons for each letter of the alphabet and 10 buttons for each single digit number. In accordance with aspects of the present invention, and using equation (1), the total number of pins n needed to produce β=36 buttons is nine (9). In contrast, using the prior art method discussed above with reference to FIGS. 1-2, a capacitive touch sensor having 36 buttons requires a minimum of twelve (12) pins.

In accordance with another aspect of the present invention, the method of detecting a touch input from a user is based on transmitting a signal through a single input/output line and detecting a modified signal received any other input/output lines. A touch input from a user will create a change in capacitance between the two input/output lines of a button. The change in capacitance will modify the signal transmitted from one input/output line to the other, which can be analyzed and detected by a controller in the capacitive touch sensing device.

In accordance with yet another aspect of the present invention, the capacitive touch sensor system provided contains a method of fault detection. The capacitive touch sensor system provided checks for faults in the display. The faults are found by comparing detected parameters with previously determined fault values.

All three of these inventive aspects will be further discussed with reference to FIGS. 5-12.

Example systems in accordance with the first aspect of the present invention will now be described with reference to FIGS. 5-8.

Figure 5:
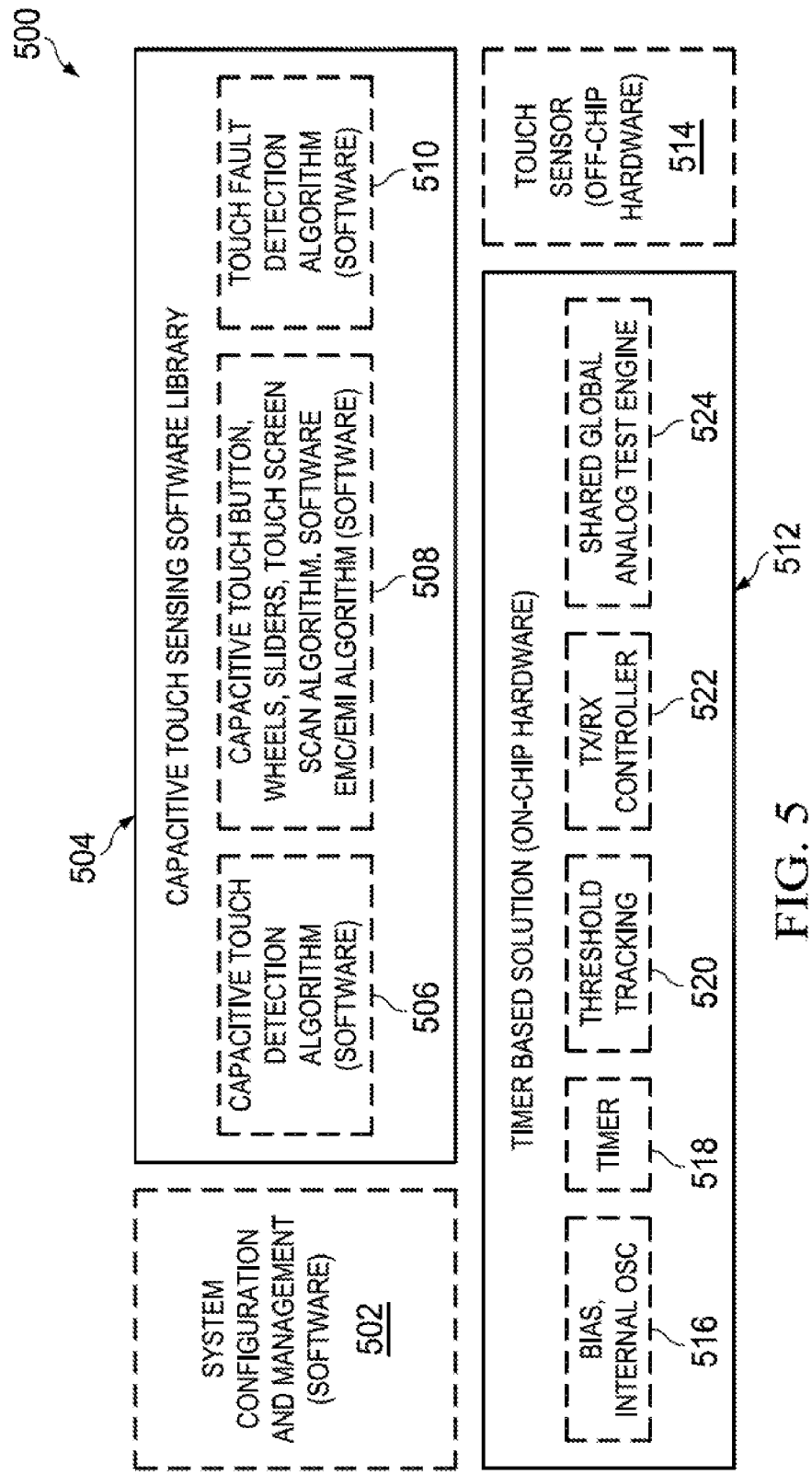
FIG. 5 illustrates a high level operation of touch sensor 500, in accordance with aspects of the present invention.

FIG. 5 illustrates the high level operation of a touch sensor 500 in accordance with aspects of the present invention.

FIG. 5 includes a system configuration and management component 502, a capacitive touch sensing software library 504, an on-chip hardware component 512 and an off-chip hardware component 514.

In this example, system configuration and management component 502, capacitive touch sensing software library 504, on-chip hardware component 512, and off-chip hardware component 514 are illustrated as individual devices. However, in some embodiments, at least two of system configuration and management component 502, capacitive touch sensing software library 504, on-chip hardware component 512, and off-chip hardware component 514 may be combined as a unitary device. Further, in some embodiments, at least one of system configuration and management component 502, capacitive touch sensing software library 504, on-chip hardware component 512, and off-chip hardware component 514 may be implemented as a computer having tangible computer-readable media for carrying or having computer-executable instructions or data structures stored thereon. Such tangible computer-readable media can be any available media that can be accessed by a general purpose or special purpose computer. Non-limiting examples of tangible computer-readable media include physical storage and/or memory media such as RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. For information transferred or provided over a network or another communications connection (either hardwired, wireless, or a combination of hardwired or wireless) to a computer, the computer may properly view the connection as a computer-readable medium. Thus, any such connection may be properly termed a computer-readable medium. Combinations of the above should also be included within the scope of computer-readable media.

Capacitive touch sensing software library 504 further includes a capacitive touch detection component 506, a touch determining component 508, and a fault detection component 510.

In this example, capacitive touch detection component 506, touch determining component 508, fault detection component 510, on-chip hardware component 512 and an off-chip hardware component 514 are illustrated as individual devices. However, in some embodiments, at least two of capacitive touch detection component 506, touch determining component 508, fault detection component 510, on-chip hardware component 512 and an off-chip hardware component 514 may be combined as a unitary device. Further, in some embodiments, at least one of capacitive touch detection component 506, touch determining component 508, fault detection component 510, on-chip hardware component 512 and an off-chip hardware component 514 may be implemented as a computer having tangible computer-readable media for carrying or having computer-executable instructions or data structures stored thereon.

On-chip hardware component 512 further includes an internal oscillator component 516, a timer 518, a threshold tracking component 520, a controller 522, and a shared global analog test engine 524.

In this example, internal oscillator component 516, timer 518, threshold tracking component 520, controller 522, and shared global analog test engine 524 are illustrated as individual devices. However, in some embodiments, at least two of internal oscillator component 516, timer 518, threshold tracking component 520, controller 522, and shared global analog test engine 524 may be combined as a unitary device. Further, in some embodiments, at least one of internal oscillator component 516, timer 518, threshold tracking component 520, controller 522, and shared global analog test engine 524 may be implemented as a computer having tangible computer-readable media for carrying or having computer-executable instructions or data structures stored thereon.

System configuration and management component 502 is operable to configure and manage a device that contains a capacitive touch sensor. Non-limiting examples of such a device include a laptop operating system or a controller of a flow rate sensor.

Capacitive touch sensing software library 504 is operable to detect and determine a touch input from a user. Capacitive touch sensing software library 504 is additionally operable to determine a touch fault.

Capacitive touch detection component 506 is operable to detect a capacitance change. In an example embodiment, capacitive touch detection component 506 is operable to convert the change in capacitance of a touch sensor into a change in frequency or a change in time. Capacitive touch detection component 506 is additionally operable to send information about the change in frequency or change in time to touch determining component 508.

Touch determining component 508 is operable to determine whether the touch sensor has actually been touched. In an example embodiment, touch determining component 508 is operable to actively scan each channel of a touch sensor in order to detect a user input via post processing of the information sent from capacitive touch detection component 506. Touch determining component 508 is additionally operable to determine the type of touch input by a user using a stored database of components.

Touch fault detection component 510 is operable to determine whether there is a fault in the touch sensor. In an example embodiment, touch fault detection component 510 is operable to determine whether the touch sensor has a fault based on predetermined fault data.

On-chip hardware component 512 is operable to house all hardware necessary for controlling off-chip hardware 514. Non-limiting examples of on-chip hardware include internal oscillator 516, timer 518, threshold tracking component 520, controller 522, and shared global analog test engine 524.

Off-chip hardware component 514 is operable to sense a user input by changing capacitance. In this example embodiment, off-chip hardware component 514 is the touch screen interface of the capacitive touch sensing device.

Internal oscillator 516 is operable to provide a clock signal on-chip hardware component 512.

Timer 518 is operable to count and record the total number of oscillations of internal oscillator 516. The count kept by timer 518, allows threshold tracking component 520 and shared global analog test engine 524 to determine if a user touch has been made or detect a fault by comparing the modifications of a signal based on time.

Threshold tracking component 520 is operable to set a parameter threshold for off-chip hardware 504. Non-limiting examples of such parameters include voltage, current, capacitance, inductance, resistance, impedance, change in voltage, change in current, change in capacitance, change in inductance, change in resistance, change in impedance or combination thereof. Threshold tracking component 520 is additionally operable to use a threshold to determine whether a touch input has been made by a user.

Controller 522 is operable to set each pin of off-chip hardware 514 to either transmit mode or receive mode.

Shared global analog test engine 524 is operable to run diagnostic tests on on-chip hardware 512 components.

Shared global analog test engine 524 is additionally operable to detect on-chip hardware 512 and off-chip hardware 514 faults.

In operation, system configuration and management component 502 will initialize the device that contains a capacitive touch sensor. After the device has been initialized, system configuration and management component 502 will turn on capacitive touch sensing software library 504.

After capacitive touch sensing software library 504 has been turned on, it will run capacitive touch detection component 506. Simultaneously, internal oscillator 516 will be turned on by system configuration and management component 502. One turned on, internal oscillator 516 will oscillate at a pre-determined frequency. Every cycle of internal oscillator 516 will be counted by timer 518. Since internal oscillator 516 oscillates at a single pre-determined frequency, time can be measured by the cycle count of timer 518.

Threshold tracking component 520 will monitor off-chip hardware 514 for a user input via a change in capacitance. Changes in capacitance that are above a pre-determined threshold, will be continuously monitored by capacitive touch detection component 506. Additionally, touch determining component 508 will instruct controller 522 to change the setting of the pins of off-chip hardware component 514 from transmit mode to receive mode.

Controller 522 will only turn one pin to transmit mode and all other pins of off-chip hardware 514 to receive mode in order to conserve power. The operation of touch determining component 508 will be further discussed with additional reference to FIGS. 6, 10, and 11.

At some later time, threshold tracking component 520 will detect a change in capacitance in off-chip hardware 514 that is above the pre-determined threshold. The change in capacitance due to a touch input by a user will be further described with reference to FIG. 7. Threshold tracking component 520 will then alert capacitive touch detection component 506 that a change in capacitance has happened. Capacitive touch detection component 506 will convert the capacitance of each channel from off-chip hardware 514 into a change in frequency of a signal or a change in time. In this example, the capacitance is converted to a change in time using timer 518. Once the capacitance of off-chip hardware 514 has been converted, capacitive touch detection component 506 sends the information to touch determining component 508.

Touch determining component 508 will cross reference the information received from capacitive touch detection component 506 with a database of components it has stored to determine the type of touch that was input by a user.

If touch detection component 508 determines that there has been a valid input from a user, it will forward the information to system configuration and management component 502. If touch detection component 508 determines that the touch input was invalid, it will assert a fault code to touch fault detection component 510.

Touch fault detection component 510 will clear the fault code. After the fault code has been cleared, it will run a touch fault detection component, via shared global analog test engine 524, two separate times in order to determine if there is a fault. If there is no fault, it will clear the fault code and instruct touch determining component 508 to continue running. If a fault is detected, touch fault detection component will transmit a fault code to system configuration and management component 502. The operation of touch fault detection component 510 will be further discussed with reference to FIG. 12. The operation of touch determining component 508 will now be described with additional reference to FIGS. 6A-6D.

Figure 6A:
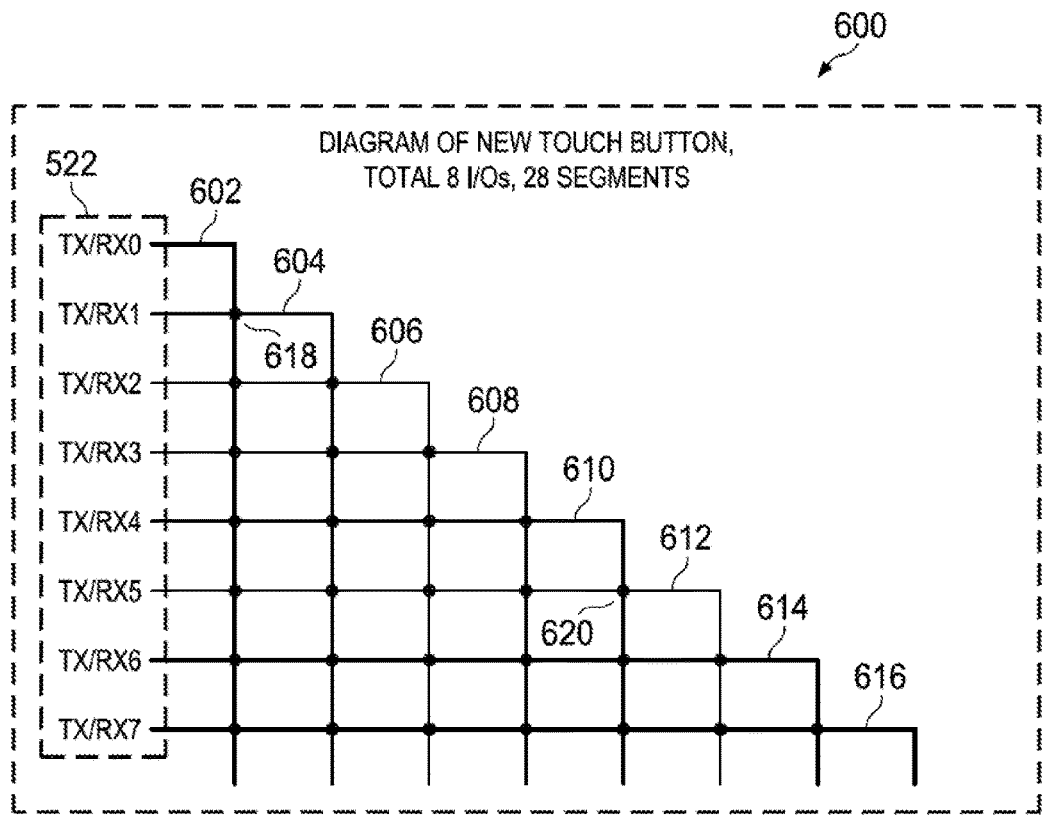
FIGS. 6A-6D illustrate button arrangement 600, in accordance with aspects of the present invention.

FIG. 6A illustrates the operation of an example button arrangement 600 of touch determining component 508 of FIG. 5 in accordance with aspects of the present invention.

Button arrangement 600 includes controller 522, a pin 602, a pin 604, a pin 606, a pin 608, a pin 610, a pin 612, a pin 614, a pin 616, and a plurality of buttons, a sample of which is indicated as button 620.

In accordance with aspects of the present invention, in a button arrangement, each signal path crosses, without electrically connecting, every other signal path. As such, each signal path is able to create a capacitance at a location where it crosses every other signal path. In this example embodiment, pin 602 is arranged such that its signal path crosses each of pin 604, pin 606, pin 608, pin 610, pin 612, pin 614, and pin 616. Pin 604 is arranged such that its signal path crosses each of pin 602, pin 606, pin 608, pin 610, pin 612, pin 614, and pin 616. Pin 606 is arranged such that its signal path crosses each of pin 602, pin 604, pin 608, pin 610, pin 612, pin 614, and pin 616. Pin 608 is arranged such that its signal path crosses each of pin 602, pin 604, pin 606, pin 610, pin 612, pin 614, and pin 616. Pin 610 is arranged such that its signal path crosses each of pin 602, pin 604, pin 606, pin 608, pin 612, pin 614, and pin 616. Pin 612 is arranged such that its signal path crosses each of pin 602, pin 604, pin 606, pin 608, pin 610, pin 614, and pin 616. Pin 614 is arranged such that its signal path crosses each of pin 602, pin 604, pin 606, pin 608, pin 610, pin 612, and pin 616. Pin 616 is arranged such that its signal path crosses each of pin 602, pin 604, pin 606, pin 608, pin 610, pin 612, and pin 614.

Additionally, pin 602, pin 604, pin 606, pin 608, pin 610, pin 612, pin 614, and pin 616 are operable to be set to either transmit mode or receive mode by controller 522.

Additionally each of pin 602, pin 604, pin 606, pin 608, pin 610, pin 612, pin 614, and pin 616 are able to transmit or receive a signal via a line. Each line carries a signal from the pin which it originates to the pin which it terminates.

A button is disposed at the positional intersection to two I/O lines. Button 618 is arranged at the intersection of the line of pin 602 and the line of pin 604. Button 620 is arranged at the intersection of the line of pin 610 and the line of pin 612. Button 618 and button 620 are disposed at the intersection of two lines, but the lines do not physically intersect. An intersection of two lines refers to the paths of two separate lines crossing. When a button disposed at the intersection of two lines is touched by a user, the electric field changes between the two lines, which creates a change in capacitance that can be detected. The change in capacitance of a button due to a user interaction will be further described with additional reference to FIG. 7.

Disposing a button at the positional intersection of two I/O lines allows a given number of pins to support more buttons than the prior art method using the same number of pins. As shown by equation (1), in this non-limiting example n=8 pins are used to create β=28 buttons by disposing a button at the intersection of any two pin lines.

In contrast, using the prior art method, a separate pin is needed for each row and column in any given button arrangement. Accordingly, a maximum of 16 buttons can be created using 8 pins. In a non-limiting example, a prior art method button arrangement may be created such that 4 pins are used for columns and 4 pins are used for rows. In this example, the lines of each of the vertical pins intersect the lines of each of the 4 horizontal pins used, creating a total of 16 intersections. Disposing a button at each intersection only creates a total of 16 buttons.

Controller 522 is operable to set each of pin 602, pin 604, pin 606, pin 608, pin 610, pin 612, pin 614, and pin 616 to either transmit mode or receive mode.

The detection of a button pressed by a user in button arrangement 600 will now be described in accordance with aspects of the present invention.

Figure 6B:
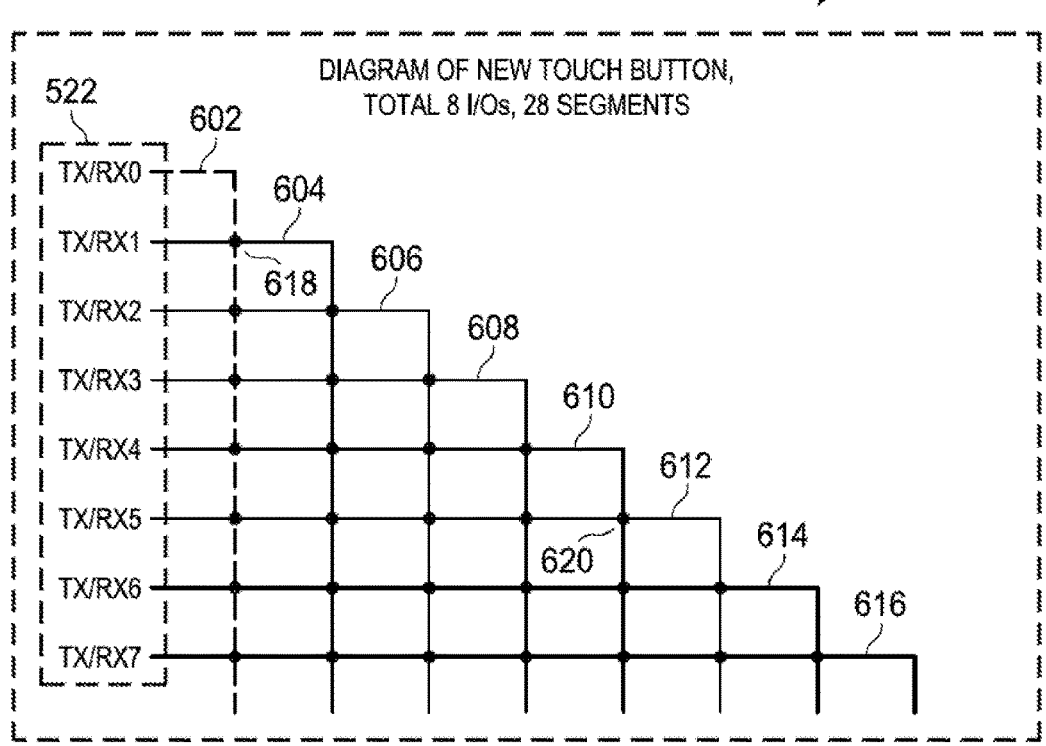

In operation, controller 522 will set one of the pins to a transmit mode, and with set the remaining pins to receive mode. For example, as illustrated in FIG. 6B controller 522 may set pin 602 to transmit mode and set each of pin 604, pin 606, pin 608, pin 610, pin 612, pin 614, and pin 616 to receive mode.

After each pin has been set to the correct mode, controller 522 will send a signal through the line of the pin that is in the transmit mode and will monitor the signal on all the remaining pins that are in receive mode. For example, controller 522 may send a signal through the line of pin 602 as illustrated in FIG. 6B. As indicated by the dotted line, after the signal has been transmitted, controller 522 will receive a signal from each of pin 604, pin 606, pin 608, pin 610, pin 612, pin 614, and pin 616.

Controller 522 will then analyze the signal received by each of pin 604, pin 606, pin 608, pin 610, pin 612, pin 614, and pin 516. If the signal received is below a pre-determined threshold, controller 522 can determine that a user hasn't touched a button.

Figure 6C:
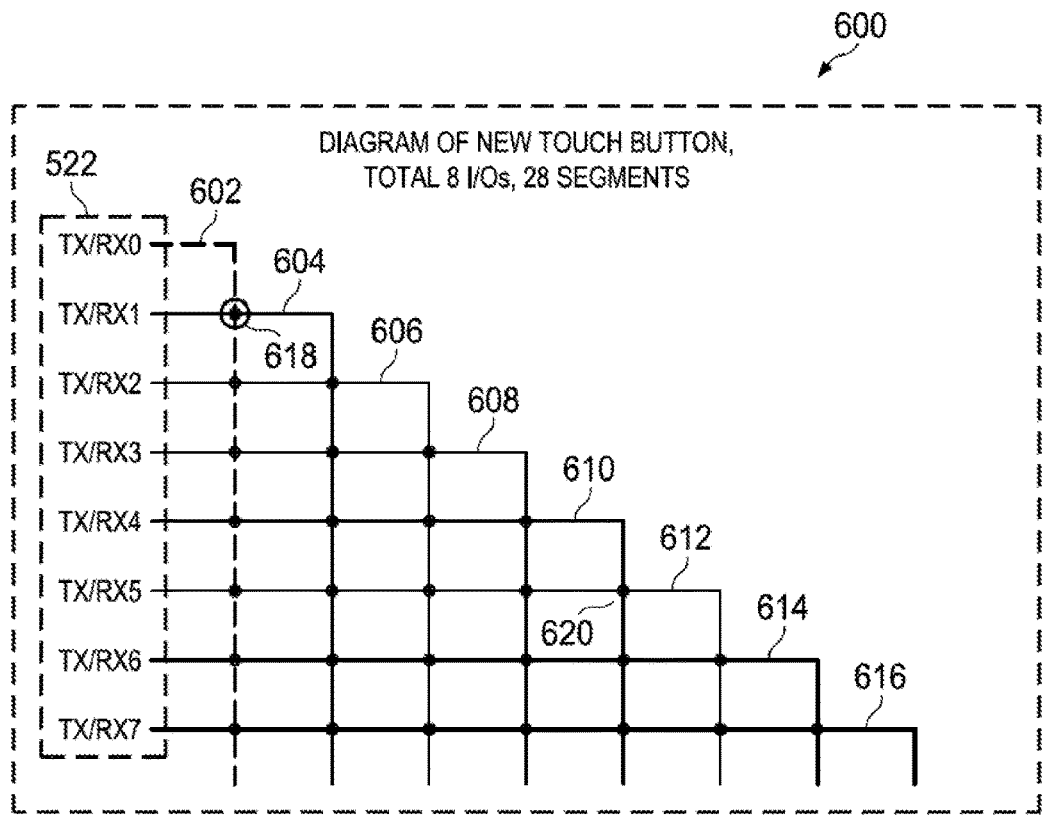

Suppose that in this example, a user has pressed button 618 as illustrated in FIG. 6C, as indicated by the circle around button 618. The capacitance of button 618 is changed once a user has touched it. The signal transmitted through the line of pin 602 by controller 522 is modified by the change in capacitance of button 618. The modified signal continues through button 618 back through the line of pin 604 and is received by controller 522.

Figure 7:
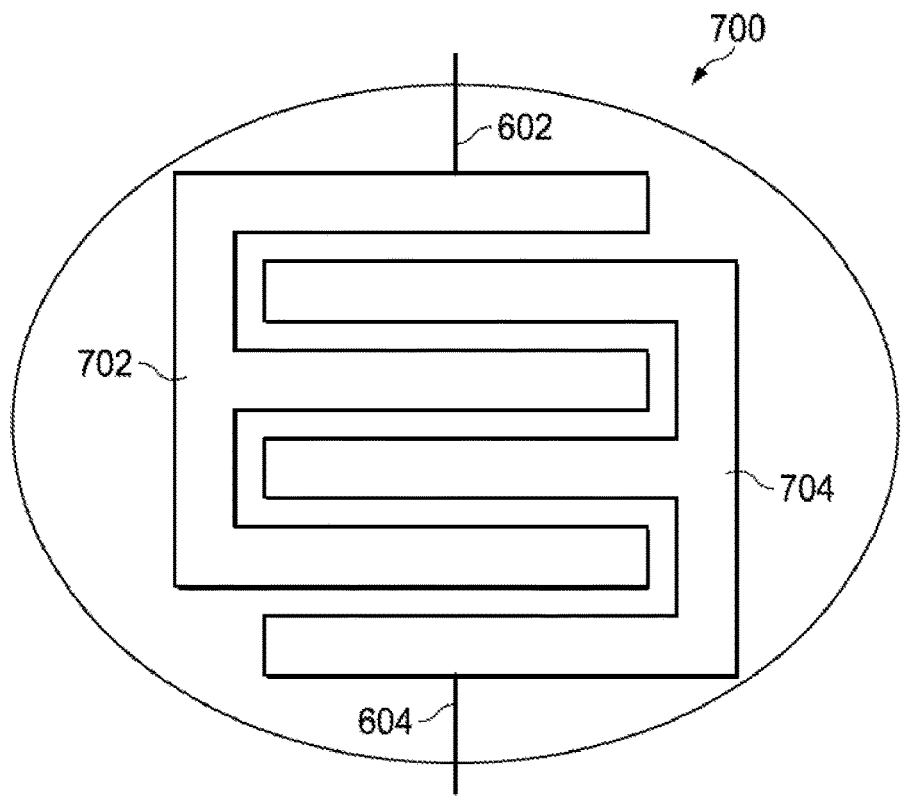
FIG. 7 illustrates the operation 700 of touch button 518, in accordance with aspects of the present invention.

The operation of button 618 will now be further described with additional reference to FIG. 7.

FIG. 7 illustrates the operation 700 of button 618 in accordance with aspects of the present invention.

As illustrated in the figure button 618 includes a conductor 702 and a conductor 704.

Conductor 702 is arranged such that it allows for the flow of a signal through a line from pin 602. Conductor 704 is arranged such that it allows for the flow of a signal through a line from pin 604. Conductor 702 and conductor 704 are additionally operable such that when a user touches button 618, the capacitance between them changes.

In operation, when button 618 is untouched the signal transmitted through the line of pin 602 is unmodified. The unmodified signal is transmitted back through the line of pin 604 by the mutual capacitance between conductor 702 and conductor 704. The unmodified signal is then received by controller 522, via pin 604, where it is determined that a touch has not been made. Button 618 is disposed at the intersection of the line of pin 602 and the line of pin 604. The intersection of line 602 and line 604 refers to the arrangement of conductor 702 and conductor 704. As shown in FIG. 7 conductor 702 and 704 do not physically touch each other.

When a user touches button 618, the electric field of conductor 702 and conductor 704 is modified, this modification changes the capacitance between conductor 702 and conductor 704. Once the capacitance has been modified the signal transmitted between conductor 702 and conductor 704 is modified as well.

After determining that a button has been touched, controller 522 can send the signal to touch determining component 508 for post processing.

Figure 6D:
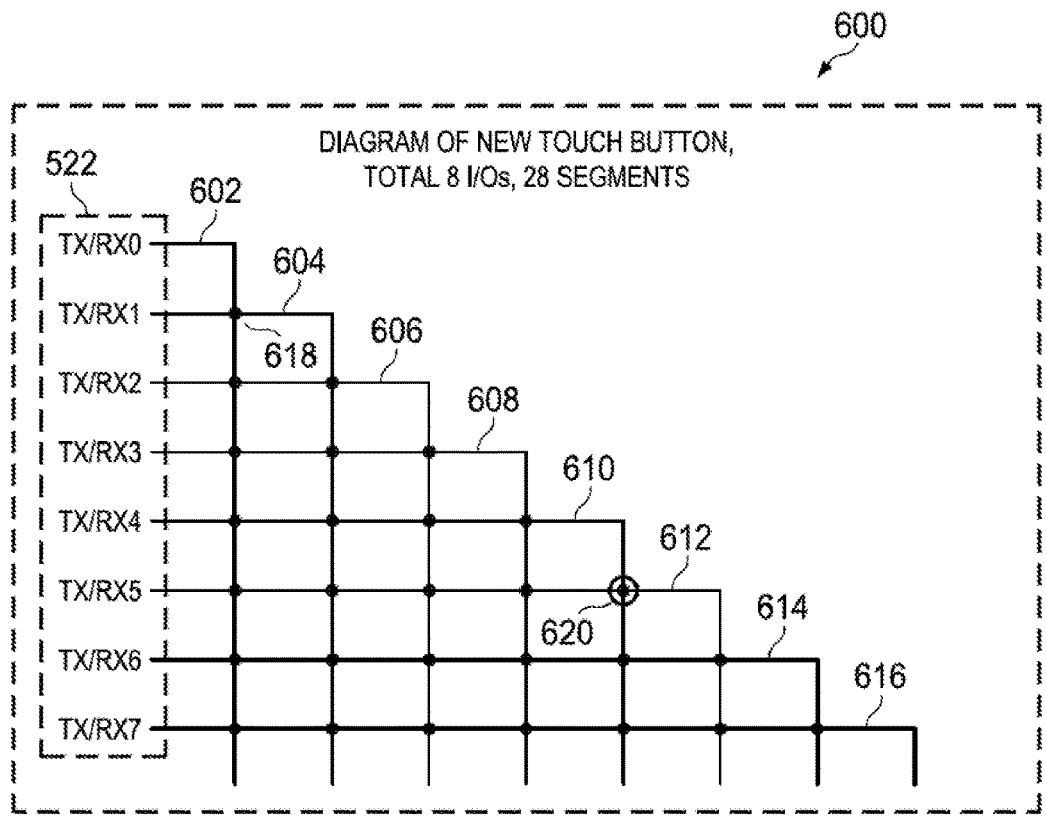

Next, controller 522 sets pin 604 to transmit mode and sets each of pin 602, pin 606, pin 608, pin 610, pin 612, pin 614, and pin 616 to receive mode. Simultaneously a user touches button 620 as illustrated in FIG. 6D.

Controller 522 then sends a signal through pin 604, and waits to receive a signal from pin 602, pin 606, pin 608, pin 610, pin 612, pin 614, and pin 616. Once the signals are received, controller 522 determines if a user has touched a button. Since button 620 is disposed at the intersection of the line of pin 610 and the line of pin 612, controller 522 cannot detect the touch.

Controller 522 continues setting each of pin 606 and pin 608 to transmit mode one at a time and setting all other pins to receive mode. After each time a new pin is set to transmit mode, controller 522 transmits a signal and then analyzes each of the signals received by the pins set to receive mode.

At some later time, controller 522 will transmit a signal through pin 610. After, controller 522 receives a signal from pin 602, pin 604, pin 606, pin 608, pin 612, pin 614, and pin 616.

Controller 522 determines that there has been no change in capacitance when checking the signals received by pin 602, pin 604, pin 606, pin 608, pin 614, and pin 616. Controller 522 determines that the signal received by pin 612 has been changed by an amount that is larger than the pre-determined threshold due to the change in capacitance of button 620.

After determining that a button has been touched, controller 522 can send the signal to touch determining component 508 for post processing.

Next controller will continue setting each of pin 612, pin 614, and pin 616 to transmit mode and all other pins to receive mode. Once controller has set 522 pin 616 to transmit mode and driven a signal, it will start over by setting pin 602 to transmit mode and all other pins to receive mode.

Figure 8:
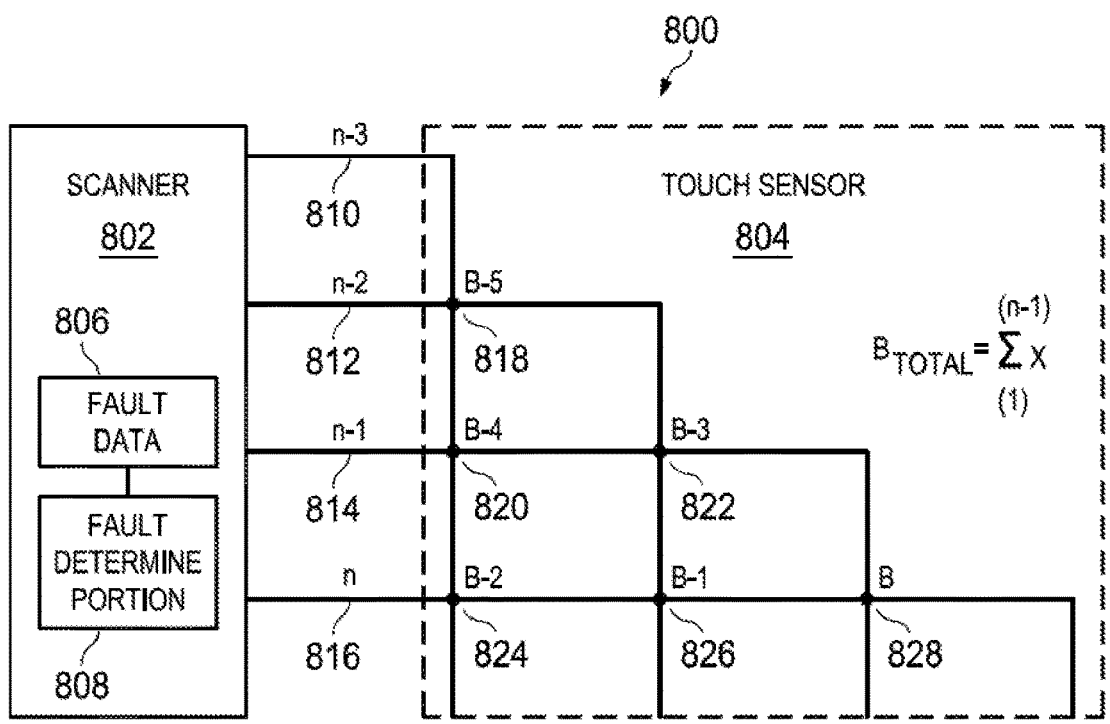
FIG. 8 illustrates the creation of a button arrangement 800, in accordance with aspects of the present invention.

FIG. 8 illustrates a button arrangement 800 in accordance with aspects of the present invention.

As illustrated in the figure, button arrangement 800 includes a scanner 802 and a touch sensor 804. Scanner 802 further includes a fault data component 806 and a fault determining component 808. Touch sensor 804 includes a pin 810, a pin 812, a pin 814, a pin 816, a button 818, a button 820, a button 822, a button 824, a button 826 and a button 828.

Scanner 802 is operable to detect a capacitance for a plurality of a number n of input/output lines, respectively, and to detect a touching of one of a number β of conductive formations based on the detected capacitances. In this example embodiment, the number n of input/output lines is 4, whereas the number β of conductive formations is 6.

A conductive formation is composed of two separate conducting elements. Each conductive element is operable to allow a voltage to pass through it from a line connected to a pin. The difference in voltage between the two conductive elements creates a capacitance in the conductive formation. The capacitance of the conductive formation can be changed when touched; a non-limiting example of a conductive formation is described in FIG. 7.

Scanner 802 is additionally operable to detect a parameter value for the n of input/output lines, respectively, and to generate comparison values based on a comparison between the detected parameter values and the fault data. Non-limiting examples of a parameter to be detected to determine whether or not a fault exists include voltage, current, capacitance, inductance, resistance, impedance, change in voltage, change in current, change in capacitance, change in inductance, change in resistance, change in impedance or combination thereof. For purposes of explanation, in the example embodiment the parameter to be detected to determine whether or not there is a fault is capacitance.

Touch sensor 804 is arranged such that it contains a number n of input/output lines; wherein each of a number of n input/output lines is electrically disconnected from every other of n input/output lines. Each number of n input/output lines is arranged to cross every other number of n of input/output lines. Each of a number β of positions includes one of number n input/output lines crossing another number of n of input/output lines.

Touch sensor 804 is arranged such that each line from a pin crosses all lines from successive pins. If touch sensor 804 is composed of 4 pins, the line from the first pin will cross the lines pin 2, pin 3, and pin 4. The line from the second pin will only cross the lines of pin 3 and pin 4. The line from the third pin will only cross the line of pin 4. A non-limiting example of an arrangement is described in FIG. 6.

Touch sensor 804 is further arranged such that when one of a number n of input/output lines having the input current therein crosses another number of n input/output lines, a respective electric field is created between one of a number n of input/output lines and another of n input/output lines.

Fault data component 806 is operable to contain a database having fault data stored therein. The fault data contained within fault data component 806 will be predetermined values for the fault parameters discussed above.

Fault determining component 808 is operable to output a fault signal based on the comparison values. A non-limiting example of a fault may include an open/short circuit, damaged touch sensor, or overheating.

Pin 810, pin 812, pin 814, and pin 816 are arranged such that when one of a number of n input/output lines having the input current therein crosses another of a number n of input/output lines, a respective electric field is created between the first number n of input/output lines and the second number n of input/output lines.

Each of pin 810, pin 812, pin 814, and pin 816 are operable to transmit and receive a current through a line. When a current is applied to a pin and transmitted through its line, an electric field is generated at the point where the two lines cross each other.

Button 818, button 820, button 822, button 824, button 826, and button 828 are arranged such that each are disposed at one of the number β of positions, respectively. One of a number of β conductive formations comprises a first conductive component and a second conductive component, the first conductive component being electrically connected to one of a number n of input/output lines, and the second conductive component being electrically connected to another of n input/output lines. An example of a button with a first conductive component and a second conductive component that are electrically connected is illustrated in FIG. 7.

A button is placed at each point where two lines from different pins cross each other. The first line is connected to one of the conductive elements of the button and the second line is connected to the other conductive element. A capacitance is created in the button when a voltage is applied to one of the pins and there is a difference in voltage between the two conductive elements. This capacitance can be modified when a user interacts with the button.

Due to the limited amount of space on mobile electronic devices, it is important to minimize the amount of space each component occupies. Today's capacitive touch sensors require an input/output (I/O) pin for each additional pin or pin of buttons used in a touch sensor. For larger or complex devices that require many buttons for controlling a device, the number of pins and consequently the area of the board that the pins are located on, increases very quickly.

In operation, an electronic device manufacturer will want to produce a capacitive touch sensor with β buttons. In a non-limiting example, if a manufacturer wanted to create a button arrangement such that β=3, using equation (1) it can be found that the total number of pins n needed to produce β buttons is 3. As illustrated in the figure the creation of button 818, button 820, and button 822 requires pin 810, pin 812, and pin 814. The use of 3 pins for the creation of 3 buttons is more efficient than the prior art method described above with reference to FIG. 1. The creation of button 112, button 114, and button 116 of FIG. 1 requires pin 102, pin 104, pin 106, and pin 108.

In another non-limiting example, a manufacturer may want to create a button arrangement such that β=6, using equation (1) it can be found that the total number of pins n needed to produce β buttons is 4. As illustrated in the figure, the creation of button 818, button 820, button 822, button 824, button 826, and button 828 requires pin 810, pin 812, pin 814, and pin 816. The use of 4 pins for the creation of 6 buttons is more efficient than the prior art method described above with reference to FIG. 1. The creation of button 112, button 114, button 116, button 118, button 120, and button 122 of FIG. 1 requires pin 102, pin 104, pin 106, pin 108, and pin 110.

In yet another non-limiting example, a manufacturer may want to create a button arrangement such that β=28 as discussed above with reference to FIG. 5. Using equation (1), it can be found that the total number pins n needed to produce β buttons is 8. The ratio of buttons per pin for creating 28 buttons using the method presented in accordance with aspects of the present invention instead of the prior art method is more pronounced as β gets larger. The prior art method of creating a grid containing 28 buttons requires a minimum of 11 pins to create a 7 by 4 arrangement containing 28 buttons.

Example systems in accordance with the second aspect of the present invention will now be described with reference to FIG. 9.

Figure 9:
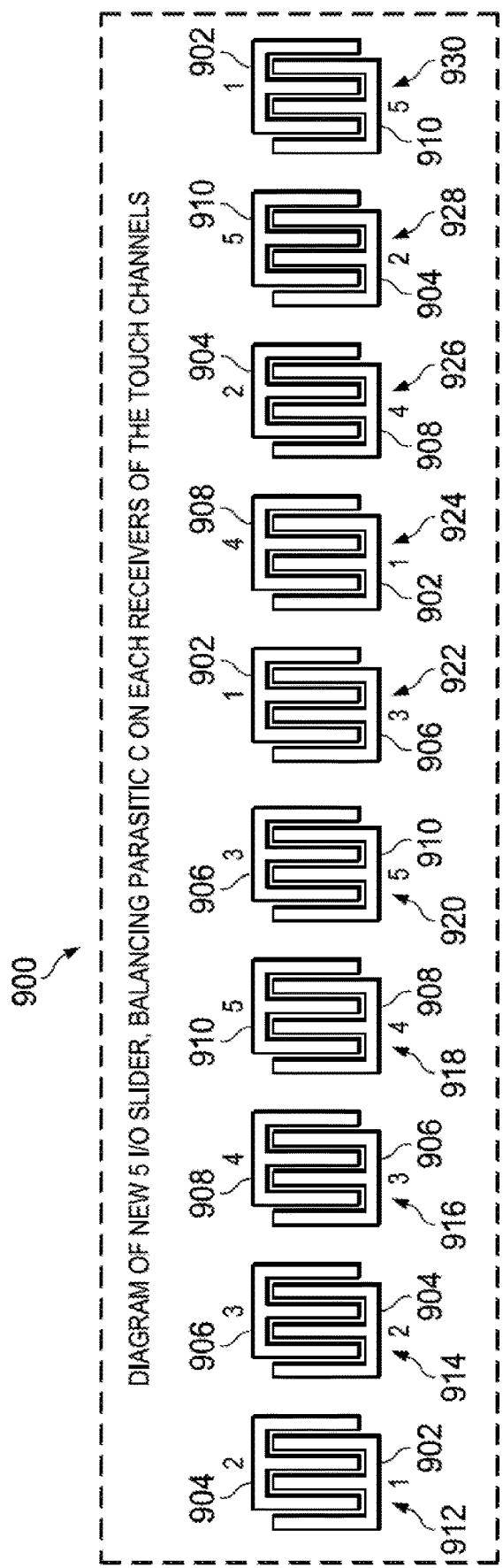
FIG. 9 illustrates a slider 900, in accordance with aspects of the present invention.

FIG. 9 illustrates a slider 900 in accordance with aspects of the present invention As illustrated in the figure, slider 900 includes a pin 902, a pin 904, a pin 906, a pin 908, a pin 910, a button 912, a button 914, a button 916, a button 918, a button 920, a button 922, a button 924, a button 926, a button 928, and a button 930.

Pin 902 is arranged such that it creates button 912 when it intersects with pin 904 and button 924 when it intersects with pin 908. Pin 904 is arranged such that it creates button 914 when it intersects with pin 906 and button 928 when it intersects with pin 910. Pin 906 is arranged such that it creates button 916 when it intersects with pin 908 and button 922 when it intersects with pin 902. Pin 908 is arranged such that it creates button 918 when it intersects with pin 910 and button 926 when it intersects with pin 904. Pin 910 is arranged such that it creates button 920 when it intersects with pin 906 and button 930 when it intersects with pin 902.

Button 912, button 914, button 916, button 918, button 920, button 922, button 924, button 926, button 928, and button 930 are operable to change their capacitance when touched by a user.

In today electronic devices it may be more practical to use a slider rather than a button. Sliders allow more precise control than on or off as a button does. Non-limiting examples of a slider use includes volume control, scroll bars, or zooming in or out. Creating a slider interface is more complex than a simple button due to the need for locating and tracking of the input from a user.

A slider is created by implementing multiple buttons in a single file pin. Each of pin 902, pin 904, pin 906, pin 908, and pin 910 are connected to two separate pins. Since each of pin 902, pin 904, pin 906, pin 908, and pin 910 are connected to two different pins, any of button 912, button 914, button 916, button 918, button 920, button 922, button 924, button 926, button 928, and button 930 that is touched can be identified by the signal received by an opposing pin.

The operation of slider 900 is similar to that of button arrangement 600 of FIG. 6. A controller will set pin 902 to transmit mode and pin 904, pin 906, pin 908, and pin 910 to receive mode. The controller will then drive a signal through pin 902 and then analyze the signals received by pin 904, pin 906, pin 908, and pin 910. If a touch is not detected it will set pin 904 to transmit mode and each of pin 902, pin 906, pin 908, and pin 910 to receive mode. The controller will continue scanning in this manner until an input is detected.

At some time later, a user will want to use slider 900, in this non-limiting example the slider is used to control the volume of a device and the device is currently at its lower limit. A user will touch button 912 changing the capacitance as described above with reference to FIG. 7.

Simultaneously, a controller sets pin 902 to receive mode and each of pin 904, pin 906, pin 908, and pin 910 to receive mode. After each of the pins have been set to the correct mode, the controller will send a signal through pin 902 and then analyze the signals received by each of pin 904, pin 906, pin 908, and pin 910.

Pin 902 crosses pin 904 and pin 908. Since the signal received by pin 908 was not modified, the controller can determine that button 924 was not touched. The controller determines that the signal received by pin 904 has been modified, which indicates that button 912 has been touched. In this method, even though pin 902 crosses more than one other pin, which button has been touched can be easily determined.

Next the user will drag their finger to button 916. Simultaneously, the controller will continue changing each pin to transmit mode while setting all others to receive mode, and analyzing the signals received by the pins that are set to receive mode.

The controller continues cycling through all of the pins until it sets pin 904 to transmit mode and each of pin 902, pin 906, pin 908, and pin 910 to receive mode. The controller sends a signal through pin 904 and determines that the signal received by pin 906 has been modified. From this information the controller can determine that a user has dragged their finger to at least button 914.

Continuing, the controller sets pin 906 to transmit mode and all other pins to receive mode. Again, the controller sends a signal through pin 906 and determines that a user has dragged their finger to at least button 916.

The controller then sets pin 908 to transmit mode and each of 902, pin 904, pin 906, and pin 910 to receive mode. The controller transmits a signal through pin 908 and then analyzes the signals received by each of 902, pin 904, pin 906, and pin 910. The controller determines that each of the signals received is unmodified. This means that the user has not moved their finger past button 916. The controller can then send a signal to the volume control mechanism of the device and adjust the volume by the factor determined by the movement from button 912 to button 916.

Example systems in accordance with the third aspect of the present invention will now be described with reference to FIGS. 10-12.

FIG. 10 illustrates the flowchart 1000 of the operation of controller 522 of FIG. 5.

Controller 522 initializes (S1002) and sets pin (i=0) to transmit mode and all other pins to receive mode. In this non-limiting example (i) starts at 0, so for n=5 pins; (i)=0, 1, 2, 3, 4.

Next, controller 522 will drive a signal on pin (i=0) (S1004) and simultaneously scan all other pins for a received signal. Once it has scanned all other pins, controller 522 checks to see if it has turned each pin to transmit mode and scanned for a touch input (S1006).

If controller 522 has not turned all pins to transmit mode and checked for a touch input, it will incrementally increase (i) by 1 (S1008). Once (i) has been increased, controller 522 will set pin (i=1) to transmit mode (S1010) and all other pins to receive mode. Again controller 522 will drive a signal on pin (1=1) and simultaneously scan all other pins for a touch input.

Controller 522 will continue cycling through each pin until it has turned each pin to transmit mode and scanned for a touch input. Once pin (1=n-1) has been switched to transmit mode and all other pins have been scanned for a touch input, controller 522 will stop scanning (S1012).

FIG. 11 illustrates the flowchart 1100 of the operation of controller 522 of FIG. 5.

Controller 522 initializes (S1102) and sets pin (i=1) to transmit mode and pin (i-1) to receive mode. In this non-limiting example (i) starts at 0, so for n=5 pins; (i)=0, 1, 2, 3, 4.

Next, controller 522 will drive a signal on pin (1=1) (S1104) and scan pin (1=0) for a received signal. Once it has scanned pin (1=0), controller 522 checks to see if it has turned each pin to transmit mode and scanned for a touch input (S1106). In contrast to FIG. 10, controller 522 is checking for a modified signal on only one pin. This allows the touch screen device to conserve energy and operate at a higher frequency. This method may be applicable in a situation such as when a user only has the option of making a touch input at single location in a much larger arrangement.

If controller 522 has not turned all pins to transmit mode and checked for a touch input, it will incrementally increase (i) by 1 (S1108). Once (i) has been increased, controller 522 will set pin (1=2) to transmit mode (S1110) and pin (i=1) to receive mode. Again, controller 522 will drive a signal on pin (1=2) and scan pin (1=1) for a touch input.

Controller 522 will continue cycling through each pin until it has turned each pin to transmit mode and scanned for a touch input. Once pin (1=n) has been switched to transmit mode and pin (i=n-1) have been scanned for a touch input, controller 522 will stop scanning (S1112).

FIG. 12 illustrates the flowchart 1200 of the operation of fault detection component 510 of FIG. 5.

In operation fault detection component 510 will receive a fault code from shared global analog test engine 524 or a fault interrupt from off-chip hardware 514. Fault detection component 510 will first clear the fault interrupt and/or fault code (S1202).

After all fault interrupts and/or fault codes have been cleared, fault detection component 510 will scan all buttons (S1204) to check their capacitance as described above with reference to FIGS. 6, 10, and 11.

Fault detection component 510 will then compare the capacitance values for each button against a stored fault table (S1206). The fault table holds all of the possible values that could be received if there is a fault within the touch sensor hardware or software operation. Fault detection component 510 will compare the received values for each button against the stored values in the fault table to determine if a fault has occurred.

If fault detection component 510 determines that none of the capacitance values match the values in the fault table, it will instruct the touch scanning device to resume normal operation (S1214). If fault detection component 510 finds that one or more the capacitance values matches a value in the stored fault table, fault detection component 510 will rescan all buttons again.

Next, fault detection component 510 will compare the capacitance values of each button from the second scan with the corresponding values from the first scan (S1208). If fault detection component 510 finds that the values do not match, it will instruct the touch scanning device to resume normal operation. If the values match, fault detection component 510 can determine that a fault has occurred.

Once it has been determine that a fault has occurred, fault detection component 510 will assert a fault interrupt and the corresponding fault code that occurred (S1210). The fault interrupt will then be received by the CPU of the touch scanning device. Once the fault interrupt and fault code have been received by the CPU, it can take the corresponding action as determined by the fault interrupt and fault code (S1212). After the fault interrupt and fault code have been cleared and action has been taken by the CPU, the touch scanning device can resume normal operation (S1214).

The prior art method of creating an array of buttons requires that for each pin and pin in the array, a separate input/output pin is needed. In an example, a manufacturer may want to create a button arrangement that contains a total of sixteen (16) buttons. Sixteen is a multiple of several different combinations, namely 1×16, 2×8, and 4×4. Since space and resources need to be conserved the rows and columns are chosen such that the total number of pins is minimized, in this example a 4×4 arrangement only uses eight pins.

A problem with the prior art method of creating a button array is that he problem with the conventional system and method of capacitive touch sensing is that for each additional row or column of buttons a new pin is needed. In order to create a large array of buttons, a large number of pins is needed to support the array. The increase in the number of pins needed uses the limited space and resources of the capacitive touch sensing device.

The prior art method of creating a small slider requires setting multiple buttons in a row and tracking a user input within the line of buttons. Each button in the small slider requires two pins, but in some cases a small slider may not be sufficient and a large slider must be implemented. If a large slider needed 16 buttons in order to be implemented, using the method for creating a small slider, a total of 32 pins would be needed. 32 pins take up too much of the limited resources and space so a different method is used to create large sliders.

Large sliders are implemented by using each button more than once in a single slider. The buttons are placed next to each other such that the sequence of button numbers is unique. This method requires fewer buttons and as a result fewer pins, but post processing for determining which of the multiple buttons has been touched is needed.

The prior art method of post processing signals from a user input in a large slider requires a controller to analyze the strength and level of modification of each signal received from the pins used to implement the slider. The strengths and levels of modification are then compared to generate the location at which a touch input was made.

A problem with the conventional system and method of implementing a slider in a capacitive touch sensing device is that creating a small slider requires two pins per button in the slider. Due to the limited space and resources, using this method it is only possible to create small sliders. It is possible to double the number of buttons used in a slider with a set number of pins, but the slider then requires post processing or additional software in order to detect user inputs.

The present invention provides a method of creating a button array that requires less pins to create the same number of buttons in an array using the prior art method. Each line of an input/output pin cross all successive pins to create an array. Crossing the lines of each input/output pin creates a number of intersections according to equation (1).

Disposing a button at the positional intersection of two input/output lines allows a given number of pins to support more buttons than the prior art method using the same number of pins. As shown by equation (1), n=8 pins are used to create R=28 buttons by disposing a button at the intersection of any two pin lines. Using n=8 pins with prior art method only allows R=16 buttons to be created.

The present invention additionally provides a method of detecting a touch input from a user that is based on transmitting a signal through a single input/output line and detecting a modified signal received any other input/output lines. A touch input from a user will create a change in capacitance between the two input/output lines of a button. The change in capacitance will modify the signal transmitted from one input/output line to the other, which can be analyzed and detected by a controller in the capacitive touch sensing device.

The method of transmitting through a single input/output line and detecting a modified signal received by any other input/output lines allows the present invention to create large button arrays as well as small/large sliders with less pins than the prior art methods. Additionally, using the current aspect of the present invention no post processing is needed to determine where a user made a touch input.

The present invention further provides a method of fault detection. The capacitive touch sensor system provided, checks for faults in the display, the faults are found by comparing detected parameters with previously determined fault values. The ability to detect faults gives the capacitive touch sensing device a method of detecting damage as well as informing a user of the fault. The prior art method does not currently provide a system or method for detecting and determining faults.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method, the method comprising:
transmitting a first signal on a first input/output line of a capacitive touch sensor device, wherein each input/output line of the capacitive touch sensor device comprises a first portion extending in a first direction and a second portion extending in a second direction orthogonal to the first direction, the first portion coupled to the second portion, wherein each input/output line of the capacitive touch sensor device is arranged so that it is electrically disconnected from each other input/output line of the capacitive touch sensor device while crossing each other input/output line of the capacitive touch sensor device, wherein at least one of the first portion or the second portion of each input/output line crosses a respective other portion of each other input/output line, and wherein a number of input/output lines of the capacitive touch sensor device is greater than or equal to 3;
receiving a second signal on a second input/output line; and
determining that a touch event has occurred in the capacitive touch sensor device based on the second signal.

2. The method of claim 1, wherein:
the capacitive touch sensor device includes a plurality of button areas, each button area corresponds to a location at which an input/output line crosses another input/output line, and wherein the plurality of button areas is equal to:

$$\Sigma_1^{(n-1)} x.$$

3. The method of claim 2, wherein:
the second signal represents a change in capacitance.

4. The method of claim 3, wherein:
the change in capacitance is responsive to a user touching one of the plurality of button areas.

5. The method of claim 1, wherein:
each input/output line is coupled to a controller; and
each input/output line is configurable, by the controller, to transmit the first signal or receive the second signal.

6. The method of claim 5, wherein:
the controller configures all other input/output lines other than the first input/output line to receive the second signal.

7. The method of claim 1, wherein:
the second signal is above a threshold.

8. The method of claim 1, wherein:
the capacitive touch sensor device includes a database having fault data stored therein and a fault determining component.

9. The method of claim 8, further comprising:
detecting a respective parameter value for each input/output line; and
generating comparison values based on a comparison between the respective parameter value for each of then input/output line and the fault data; and
wherein the fault determining component is operable to output a fault signal based on the comparison values.

10. The method of claim 8, wherein:
the fault data includes one of an open circuit, a short circuit, a damaged touch sensor, and an indication of overheating.

11. An apparatus, the apparatus comprising:
a capacitive touch sensor device including a plurality of input/output lines; and
a controller coupled to the plurality of input/output lines, the controller configured to:
transmit a first signal on a first input/output line of the plurality of input/output lines of the capacitive touch sensor device, wherein each input/output line of the plurality of input/output lines comprises a first portion extending in a first direction and a second portion extending in a second direction orthogonal to the first direction, the first portion coupled to the second portion, wherein each of the plurality of input/output lines is arranged so that it is electrically disconnected from each other one of the plurality of input/output lines while crossing each other one of the plurality of input/output lines, wherein at least one of the first portion or the second portion of each of the plurality of input/output lines crosses a respective other portion of each other one of the plurality of input/output lines, and wherein a number of input/output lines of the plurality of input/output lines is greater than or equal to 3;
receive a second signal on an input/output line of the plurality of input/output lines other than the first input/output line; and
determine that a touch event has occurred in the capacitive touch sensor device based on the second signal.

12. The apparatus of claim 11, wherein:
the capacitive touch sensor device includes a plurality of button areas, each button area corresponds to a location at which one of the plurality of input/output lines crosses another one of the plurality of input/output lines, and wherein the plurality of button areas is equal to:

$$\Sigma_1^{(n-1)} x.$$

13. The apparatus of claim 12, wherein:
the second signal represents a change in capacitance.

14. The apparatus of claim 13, wherein:
the change in capacitance is responsive to a user touching one of the plurality of button areas.

15. The apparatus of claim 11, wherein:
the plurality of input/output lines are each configurable, by the controller, to transmit the first signal or receive the second signal.

16. The apparatus of claim 15, wherein:
the controller configures all of the plurality of input/output lines other than the first input/output line to receive the second signal.

17. The apparatus of claim 11, wherein:
the second signal is above a threshold.

18. The apparatus of claim 11, further comprising:
a database having fault data stored therein; and
a fault determining component.

19. The apparatus of claim 18, wherein:
the controller is further configured to:
detect a respective parameter value for each of the plurality of input/output lines; and
generate comparison values based on a comparison between the respective parameter value for each of the plurality of input/output lines and the fault data; and
wherein the fault determining component is operable to output a fault signal based on the comparison values.

20. The apparatus of claim 18, wherein:
the fault data includes one of an open circuit, a short circuit, a damaged touch sensor, and an indication of overheating.

\* \* \* \* \*